United States Patent
Yu et al.

(10) Patent No.: US 9,781,994 B2
(45) Date of Patent: Oct. 10, 2017

(54) WAFER CLEANING

(71) Applicant: Taiwan Semiconductor Manufacturing Company Limited, Hsin-Chu (TW)

(72) Inventors: Shang-Yuan Yu, Hsinchu (TW); Ming-Te Chen, Hsinchu (TW); Chi-Fu Yu, Hsin-Chu (TW); Shao-Yen Ku, Jhubei (TW); Tzu-Yang Chung, Hsin-Chu (TW); Hsiao Chien-Wen, Hsinchu (TW); Shan-Ching Lin, Hsin-Chu (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 835 days.

(21) Appl. No.: 13/707,947

(22) Filed: Dec. 7, 2012

(65) Prior Publication Data

US 2014/0158155 A1 Jun. 12, 2014

(51) Int. Cl.
*H01L 21/64* (2006.01)
*A46B 9/00* (2006.01)
(Continued)

(52) U.S. Cl.
CPC .............. *A46B 9/00* (2013.01); *A46B 11/00* (2013.01); *H01L 21/67046* (2013.01); *H01L 21/6704* (2013.01)

(58) Field of Classification Search
CPC .......... A46B 13/04; B08B 1/006; B08B 3/00; H01L 21/6704; H01L 21/67028
(Continued)

(56) References Cited

U.S. PATENT DOCUMENTS 2,563,049 A * 8/1951 Liebelt ................. B05C 17/025
15/227
3,826,581 A * 7/1974 Henderson .......... B05C 17/0308
401/188 R
(Continued)

FOREIGN PATENT DOCUMENTS

JP 2002222788 A 8/2002
KR 1020060123500 A 7/2005
(Continued)

OTHER PUBLICATIONS

English Translation of Korean Office action, dated Aug. 5, 2014, 4 pages.
(Continued)

*Primary Examiner* — Michael Jennings
(74) *Attorney, Agent, or Firm* — Cooper Legal Group, LLC (57) ABSTRACT

One or more techniques or systems for cleaning wafers during semiconductor fabrication or an associated brush are provided herein. In some embodiments, the brush includes a brush body and one or more inner hole supports within the brush body. For example, a first inner hole support and a second inner hole support define a first inner hole associated with a first size. For another example, a third inner hole support and a fourth inner hole support define a second inner hole associated with a second size different than the first size. In some embodiments, a cleaning solution is applied to a wafer based on a first flow rate at a first brush position and based on a second flow rate at a second brush position. In this manner, a flow field associated with wafer cleaning is provided, thus enhancing cleaning efficiency, for example.

20 Claims, 3 Drawing Sheets

(51) Int. Cl.
*A46B 11/00* (2006.01)
*H01L 21/67* (2006.01)

(58) Field of Classification Search
USPC .............................................. 15/230, 230.16
See application file for complete search history.

(56) References Cited

U.S. PATENT DOCUMENTS

| | | | |
|---|---|---|---|
| 6,247,197 B1* | 6/2001 | Vail ........................... | B08B 1/04 118/259 |
| 6,261,378 B1* | 7/2001 | Hashimoto ............. | B08B 1/008 134/26 |
| 6,439,962 B1* | 8/2002 | Ato ........................... | B08B 1/04 451/6 |
| 6,523,210 B1* | 2/2003 | Andros ..................... | B08B 1/04 134/1.3 |
| 7,516,507 B1* | 4/2009 | Oxsen ....................... | B08B 1/04 15/102 |
| 8,092,730 B2* | 1/2012 | Wargo ................. | B29C 33/0033 15/102 |
| 8,181,304 B1* | 5/2012 | Kamath ................. | A46B 9/023 132/120 |
| 2002/0002991 A1* | 1/2002 | Lindner ............ | H01L 21/68728 134/153 |
| 2002/0179148 A1* | 12/2002 | Lull ..................... | G05D 7/0664 137/487.5 |
| 2004/0000328 A1* | 1/2004 | Liu ........................... | B08B 3/02 134/30 |
| 2004/0200409 A1* | 10/2004 | Svirchevski ...... | H01L 21/67028 118/70 |
| 2007/0163066 A1* | 7/2007 | Okuzono ................. | B08B 1/04 15/230 |
| 2008/0211526 A1* | 9/2008 | Shinma .............. | G01R 31/2865 324/750.28 |
| 2008/0314870 A1* | 12/2008 | Inoue ....................... | B08B 1/04 216/38 |
| 2009/0029277 A1* | 1/2009 | Okuda .................. | G03G 5/147 430/96 |
| 2013/0098397 A1* | 4/2013 | Wang ................ | H01L 21/02074 134/6 |
| 2013/0199580 A1* | 8/2013 | Zhang .................... | A46B 13/02 134/95.2 |

FOREIGN PATENT DOCUMENTS

| | | |
|---|---|---|
| KR | 20110081503 A | 7/2011 |
| KR | 20110082365 A | 7/2011 |

OTHER PUBLICATIONS

Korean Office Action, dated Aug. 5, 2014, 3 pages.
Korean Proposed Response to Office Action, 3 pages.
Korean Notice of Allowance corresponding application No. 10-2013-0023389, dated Feb. 24, 2015, 3 pages.

* cited by examiner

WAFER CLEANING

BACKGROUND

Generally, wafers are often subject to chemical mechanical planarization (CMP). Sometimes, water is used to clean a wafer after CMP. However, wafers can suffer from scratch defects during cleaning.

BRIEF DESCRIPTION OF THE DRAWINGS

Aspects of the disclosure are understood from the following detailed description when read with the accompanying drawings. It will be appreciated that elements, structures, etc. of the drawings are not necessarily drawn to scale. Accordingly, the dimensions of the same may be arbitrarily increased or reduced for clarity of discussion, for example.

DETAILED DESCRIPTION

Embodiments or examples, illustrated in the drawings are disclosed below using specific language. It will nevertheless be understood that the embodiments or examples are not intended to be limiting. Any alterations and modifications in the disclosed embodiments, and any further applications of the principles disclosed in this document are contemplated as would normally occur to one of ordinary skill in the pertinent art.

Figure 2:
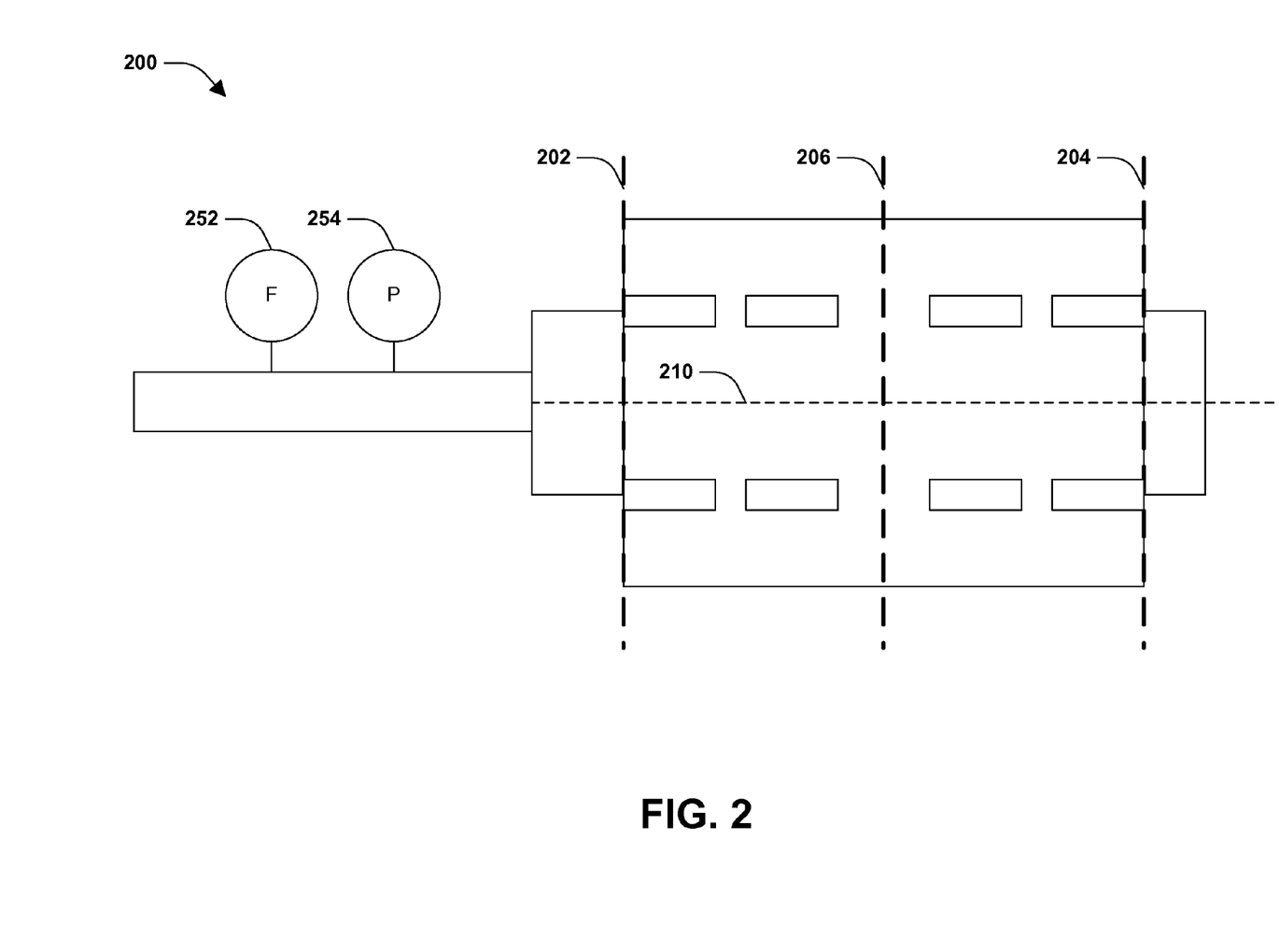
FIG. 2 is a cross-sectional view of an example brush for cleaning wafers during semiconductor fabrication, according to some embodiments.

It will be appreciated that for at least some of the figures herein, one or more boundaries, such as at least one of boundary 202, 204, or 210 of FIG. 2, for example, are drawn with different heights, widths, perimeters, aspect ratios, etc. relative to one another merely for illustrative purposes, and are not necessarily drawn to scale. For example, because dashed or dotted lines are used to represent different boundaries, if the dashed and dotted lines were drawn on top of one another they would not be distinguishable in the figures, and thus are drawn slightly apart from one another, in at least some of the figures, so that they are distinguishable from one another, for example. As another example, because a component is associated with an irregular shape, a box drawn with a dashed line, dotted lined, etc. does not necessarily encompass an entire component. Similarly, a drawn box does not necessarily encompass merely the associated component, but encompasses at least some of one or more other components as well, in some embodiments. Accordingly, dimensions of some of these boundaries are drawn taller, shorter, wider, narrower, etc. than needed in some embodiments so that the different boundaries are visible in the figures, for example.

Figure 1:
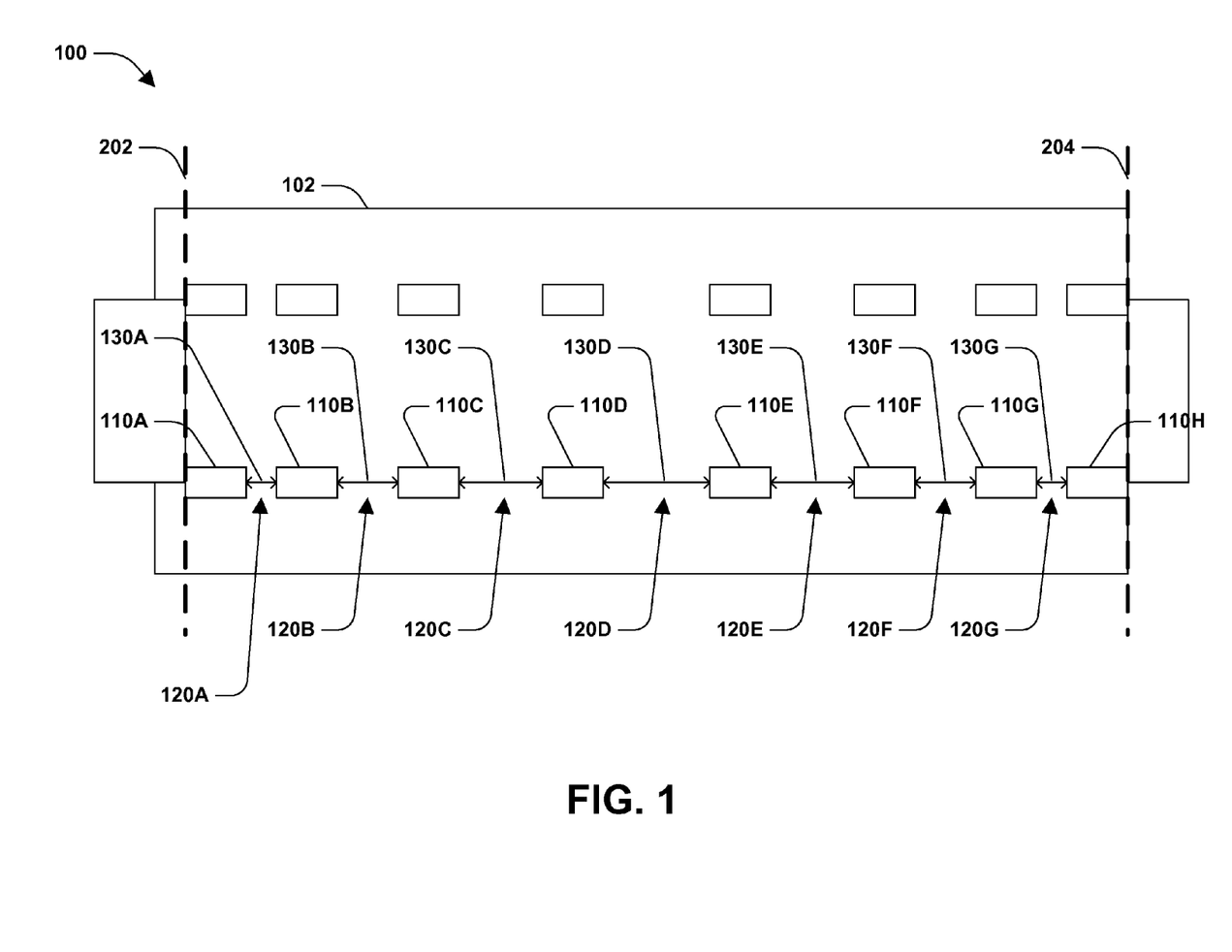
FIG. 1 is a cross-sectional view of an example brush for cleaning wafers during semiconductor fabrication, according to some embodiments.

FIG. 1 is a cross-sectional view 100 of an example brush for cleaning wafers during semiconductor fabrication, according to some embodiments. In some embodiments, the brush of FIG. 1 comprises a brush body 102. In some embodiments, the brush body 102 comprises a brush bar configured to provide structural support for the brush. In some embodiments, the brush comprises one or more inner hole supports. In some embodiments, the brush comprises one or more inner holes defined by at least some of the inner hole supports. Additionally, an inner hole is generally associated with a corresponding size or hole distance. It will be appreciated that the brush of FIG. 1 comprises any number of inner hole supports, and respective inner hole supports are arranged in various patterns in various embodiments. Similarly, the brush of FIG. 1 comprises any number of inner holes, and respective inner holes are arranged in various patterns in various embodiments. The brush of FIG. 1 comprises inner hole supports 110A, 110B, 110C, 110D, 110E, 110F, 110G, and 110H. In some embodiments, inner hole support 110A is along a first edge 202 of the brush and inner hole support 110H is along a second edge 204 of the brush, as will be discussed herein. In some embodiments, a space or a distance between inner hole supports is associated with an inner hole and a corresponding size. For example, inner hole 120A is defined by a distance 130A between inner hole support 110A and inner hole support 110B. Similarly, inner hole 120B is defined by a distance 130B between inner hole support 110B and inner hole support 110C. In some embodiments, inner hole 120C is defined by a distance 130C between inner hole support 110C and inner hole support 110D. In some embodiments, inner hole 120D is defined by a distance 130D between inner hole support 110D and inner hole support 110E. In some embodiments, inner hole 120E is defined by a distance 130E between inner hole support 110E and inner hole support 110F. In some embodiments, inner hole 120F is defined by a distance 130F between inner hole support 110F and inner hole support 110G. In some embodiments, inner hole 120G is defined by a distance 130G between inner hole support 110G and inner hole support 110H. In some embodiments, inner hole support 110A is adjacent to inner hole 120A, adjacent to inner hole support 110B, adjacent to inner hole 120B, adjacent to inner hole support 110C, adjacent to inner hole 120C, adjacent to inner hole support 110D, adjacent to inner hole 120D, adjacent to inner hole support 110E, adjacent to inner hole 120E, adjacent to inner hole support 110F, adjacent to inner hole 120F, adjacent to inner hole support 110G, adjacent to inner hole 120G, adjacent to inner hole support 110H.

In some embodiments, one or more of the inner hole supports are spaced to form a gradient spacing pattern. For example, the gradient spacing pattern is formed based on one or more successive hole distances, such as at least one of distance 130A, distance 130B, distance 130C, distance 130D, distance 130E, distance 130F, or distance 130G, arranged in at least one of an increasing fashion or a decreasing fashion. In some embodiments, inner hole 120D is associated with distance 130D, and distance 130D is greater than at least one of distance 130C or distance 130E associated with inner holes 120C or 120E, respectively. In some embodiments, at least one of distance 130C or distance 130E is greater than at least one of distance 130B or distance 130F associated with inner holes 120B or 120F, respectively. In some embodiments, at least one of distance 130B or distance 130F is greater than at least one of distance 130A or distance 130G associated with inner holes 120A or 120G, respectively. In some embodiments, at least some of the hole distances are symmetrical. For example, in some embodiments, distance 120C is substantially equal to distance 120E. In some embodiments, distance 120B is substantially equal to distance 120F. In some embodiments, distance 120A is substantially equal to distance 120G.

In some embodiments, a middle hole distance for a middle inner hole is greater than one or more other hole distances. It will be appreciated, however, that some embodiments are associated with one or more middle inner holes. In some embodiments, distance 120D is greater than at least one of distance 120A, distance 120B, distance 120C, distance 120E, distance 120F, or distance 120G. For example, merely distance 120D is greater than one or more other hole distances such that distance 120A, distance 120B, distance 120C, distance 120E, distance 120F, or distance 120G are substantially equal.

It will be appreciated that a first hole distance or a first size greater than a second hole distance or a second size is associated with a greater flow rate, at least because a larger inner hole enables more cleaning solution to flow from the brush, for example. For example, in some embodiments, the brush of FIG. 1 is used for cleaning a wafer after chemical mechanical planarization (CMP), such as during a post CMP clean. In some embodiments, a cleaner or a cleaning solution, such as water or de-ionized water (DIW) is applied to the wafer via the brush. For example, the DIW flows through one or more inner holes to the wafer. In some embodiments, the DIW flows through at least one of inner hole 120A, 120B, 120C, 120D, 120E, 120F, or 120G. Accordingly, a flow rate associated with a brush position or an inner hole is controlled by adjusting spacing between one or more inner hole supports, such as inner hole supports 110A, 110B, 110C, 110D, 110E, 110F, 110G, or 110H. In this way, scratch defects associated with wafer cleaning are mitigated, for example. In some embodiments, a flow rate associated with an edge of the wafer, such as around inner hole 120A or inner hole 120G is less than a flow rate not associated with edges of the wafer, such as flow rates associated with at least one of inner hole 120B, 120C, 120D, 120E, 120F, etc.

In some embodiments, a first inner hole support and a second inner hole support define a first inner hole associated with a first size. For example, according to some aspects, the first inner hole support is inner hole support 110A and the second inner hole support is inner hole support 110B. Accordingly, in this example, the first inner hole is inner hole 120A associated with hole distance 130A. In some embodiments, a third inner hole support and a fourth inner hole support define a second inner hole associated with a second size different than the first size. For example, the third inner hole support is inner hole support 110C and the fourth inner hole support is inner hole support 110D. In this example, the second inner hole is inner hole 120C associated with hole distance 130C. In some embodiments, the second size is greater than the first size, at least because the second size is associated with hole distance 130C, the first size is associated with hole distance 130A, and hole distance 130C is greater than hole distance 130A. In some embodiments, the brush comprises a fifth inner hole support and a sixth inner hole support. For example, the fifth inner hole support and the sixth inner hole support define a third inner hole associated with a third size. In some embodiments, the fifth inner hole support is inner hole support 110E and the sixth inner hole support is 110F. Accordingly, in this embodiment, the third inner hole is inner hole 120E associated with hole distance 130E.

However, in other embodiments, the second inner hole support is the same as the third inner hole support. For example, the first inner hole support and the second inner hole support define the first inner hole associated with the first size. In this example, the first inner hole support is inner hole support 110A and the second inner hole support is inner hole support 110B. Accordingly, in this example, the first inner hole is inner hole 120A associated with hole distance 130A. In some embodiments, the third inner hole support and the fourth inner hole support are used to define the second inner hole associated with the second size different than the first size. However, in some embodiments, since the third inner hole support is the second inner hole support, the third inner hole support is 110B and the fourth inner hole support is 110C. Accordingly, in this example, the second inner hole is defined as inner hole 120B associated with hole distance 130B. Accordingly, it will be appreciated that in some embodiments, at least some of the inner hole supports are configured to at least one of overlap or be the same, for example. In some embodiments, the second size is greater than the first size, at least because the second size is associated with hole distance 130B, the first size is associated with hole distance 130A, and hole distance 130B is greater than hole distance 130A. In some embodiments, the brush comprises a fifth inner hole support and a sixth inner hole support. For example, the fifth inner hole support and the sixth inner hole support define a third inner hole associated with a third size. In some embodiments, the fifth inner hole support is inner hole support 110C and the sixth inner hole support is 110D. Accordingly, in this embodiment, the third inner hole is inner hole 120C associated with hole distance 130C. In some embodiments, the first size is less than the second size. In some embodiments, the second size is less than the third size at least because the second size is associated with hole distance 130B, the third size is associated with hole distance 130C, and hole distance 130B is less than hole distance 130C.

In some embodiments, a first inner hole support is closer to a first edge 202 of the brush body 102 than a second inner hole support is to the first edge 202 of the brush body 102. For example, inner hole support 110A is closer to a first edge 202, such as a left edge, of the brush body 102 than inner hole support 110B is to the first edge 202 of the brush body 102. Similarly, inner hole support 110B is closer to the first edge 202 of the brush body 102 than inner hole support 110C is to the first edge 202 of the brush body 102. Accordingly, inner hole supports 110D, 110E, 110F, 110G, and 110H are successively farther and farther from the first edge 202 of the brush body 102, for example. In some embodiments, inner hole support 110H is at a second edge 204, such as a right edge, of the brush body 102.

In some embodiments, the brush comprises a first middle inner hole support and a second middle inner hole support defining a middle inner hole associated with a middle hole size. In some embodiments, inner hole support 110D is a first middle inner hole support and inner hole support 110E is a second middle inner hole support. In some embodiments, the middle inner hole is inner hole 120D and the middle hole size is associated with hole distance 130D. In some embodiments, the middle inner hole positioned such that a distance from the middle inner hole to a first edge 202 of the brush body is substantially equal to a distance from the middle inner hole to a second edge 204 of the brush body. For example, in some embodiments the middle inner hole is inner hole 120D. Additionally, inner hole 120D is centered such that a distance from the inner hole 120D to a first edge 202, such as a left edge of the brush body 102 is substantially equal to a distance from the inner hole 120D to a second edge 204, such as a right edge of the brush body 102. It will be appreciated that in some embodiments, one or more middle inner holes are associated with the brush. In this way, one or more 'middle' or middle inner holes are located within the brush, for example. In some embodiments, the middle hole size greater than at least one of the first size or the second size. For example, if inner hole 120D is the middle inner hole, the middle hole size is associated with hole distance 130D. Accordingly, 130D is greater than at least one of a first hole distance or a second hole distance, such as at least one of 130A, 130B, or 130C, for example.

FIG. 2 is a cross-sectional view 200 of an example brush for cleaning wafers during semiconductor fabrication, according to some embodiments. In some embodiments, the brush of FIG. 2 comprises a flow meter 252 configured to control a flow rate associated with a cleaning solution dispensed by the brush. In some embodiments, the brush comprises a pressure transducer 254 configured to control a pressure associated with a cleaning solution dispensed by the brush. In some embodiments, the brush body 102 comprises a brush bar configured to provide structural support, for example. In some embodiments, the brush body of FIG. 2 is associated with a first edge 202 and a second edge 204. Additionally, in some embodiments, the brush body 102 is associated with a middle 206 or a center, for example. In some embodiments, the brush is configured to at least one of spin or rotate along an axis, such as 210, for example. In some embodiments, a flow rate associated with a middle 206 is greater than a flow rate associated with an edge, such as at least one of 202 or 204, at least because a hole distance for an inner hole at the middle 206 is greater than a hole distance for an inner hole at the edge 202 or 204, for example.

Figure 3:
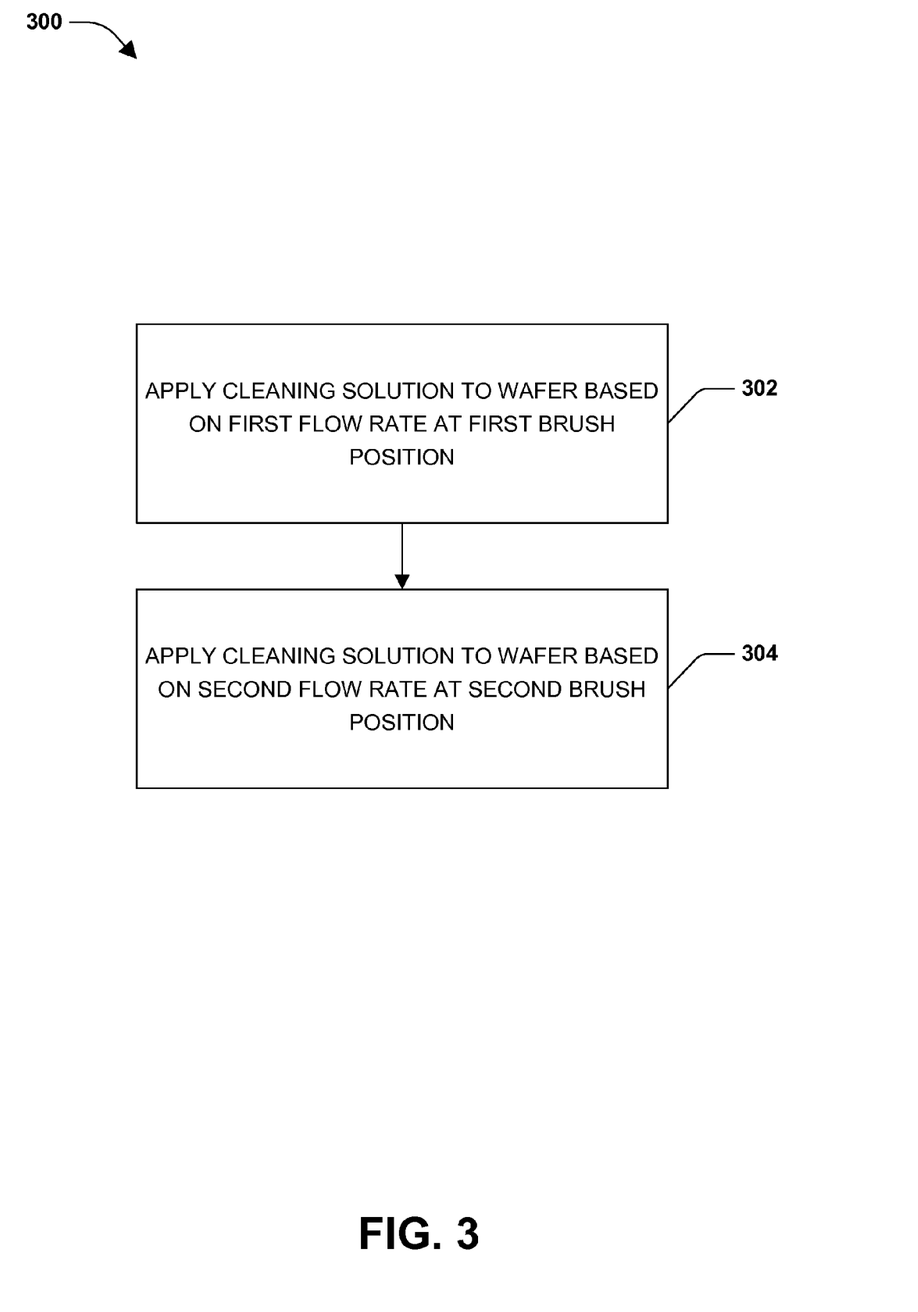
FIG. 3 is a flow diagram of an example method for cleaning wafers during semiconductor fabrication, according to some embodiments.

FIG. 3 is a flow diagram of an example method 300 for cleaning wafers during semiconductor fabrication, according to some embodiments. In some embodiments, the method 300 comprises applying a cleaning solution to a wafer based on a first flow rate at a first brush position at 302. In some embodiments, the first brush position is based on at least one of one or more inner holes or one or more inner hole supports. For example, the first brush position is associated with the inner hole 120A. At 304, the method 300 comprises applying the cleaning solution to the wafer based on a second flow rate at a second brush position. In some embodiments, the second brush position is based on at least one of one or more inner holes or one or more inner hole supports. For example, the second brush position is associated with the inner hole 120A.

One or more techniques or systems for cleaning wafers post chemical mechanical planarization (CMP) are provided herein. Generally, a cleaner or a cleaning solution, such as de-ionized water (DIW) is applied to a wafer after CMP. In some embodiments, a flow rate closer to the middle or center of the wafer is greater than a flow rate associated with an edge of the wafer. For example, a brush used for cleaning wafers is configured to apply a cleaning solution based on a first flow rate at a first brush position and a second flow rate at a second brush position. In some embodiments, the second brush position is at least one of closer to or at a middle or center of the brush. In some embodiments, the first brush position is at least one of closer to an edge or at an edge of the brush. Accordingly, in some embodiments, the second flow rate is greater than the first flow rate. In some embodiments, a greater flow rate is achieved at the second brush location based on a second inner hole associated with a second size. In some embodiments, the second size is greater than a first size of a first inner hole. Accordingly, the first inner hole is defined by a first inner hole support and a second inner hole support and the second inner hole is defined by a third inner hole support and a fourth inner hole support, according to some aspects.

According to some aspects, a brush for cleaning wafers during semiconductor fabrication is provided, comprising a brush body. In some embodiments, the brush comprises one or more inner hole supports within the brush body. For example, a first inner hole support and a second inner hole support define a first inner hole associated with a first size. For another example, a third inner hole support and a fourth inner hole support define a second inner hole associated with a second size different than the first size.

According to some aspects, a brush for cleaning wafers during semiconductor fabrication is provided, comprising a brush body. In some embodiments, the brush comprises one or more inner hole supports within the brush body. For example, a first inner hole support and a second inner hole support define a first inner hole associated with a first size. For another example, a first middle inner hole support and a second middle inner hole support define a middle inner hole associated with a middle hole size. In some embodiments, the middle hole size is greater than the first size.

According to some aspects, a method for cleaning wafers during semiconductor fabrication is provided, comprising applying a cleaning solution to a wafer based on a first flow rate at a first brush position. In some embodiments, the method comprises applying the cleaning solution to the wafer based on a second flow rate at a second brush position.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing the claims.

Various operations of embodiments are provided herein. The order in which some or all of the operations are described should not be construed as to imply that these operations are necessarily order dependent. Alternative ordering will be appreciated based on this description. Further, it will be understood that not all operations are necessarily present in each embodiment provided herein.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application are generally construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used in either the detailed description or the claims, such terms are intended to be inclusive in a manner similar to the term "comprising".

Also, although the disclosure has been shown and described with respect to one or more implementations, equivalent alterations and modifications will occur based on a reading and understanding of this specification and the annexed drawings. The disclosure includes all such modifications and alterations and is limited only by the scope of the following claims.

What is claimed is:

1. A brush for cleaning wafers during semiconductor fabrication, comprising:
   a brush body, wherein:
      the brush body has a center region spaced proximate to an axis of rotation about which the brush body rotates and a distal region spaced away from the axis of rotation,
      the brush body has two edges and a mid-point disposed on the axis of rotation,
      the mid-point is between the two edges, and
      the brush body comprises:

a first inner hole support and a second inner hole support defining a first inner hole intersected by a first axis extending parallel to the axis of rotation, wherein:
the first inner hole has a first size as measured along the first axis, and
at least some fluid is dispensed from the brush body in a direction from the center region to the distal region through the first inner hole;
a third inner hole support and a fourth inner hole support defining a second inner hole intersected by the first axis, wherein:
the second inner hole has a second size as measured along the first axis,
the second size is different than the first size, and
at least some of the fluid is dispensed from the brush body in the direction from the center region to the distal region through the second inner hole; and
a fifth inner hole support and a sixth inner hole support defining a third inner hole intersected by the first axis, wherein:
the third inner hole is nearer to the mid-point of the brush body than the first inner hole and the second inner hole are to the mid-point,
the third inner hole has a third size as measured along the first axis,
the third size is greater than the first size and the second size such that a flow rate of the fluid near the mid-point is greater than the flow rate near the two edges of the brush body, and
at least some of the fluid is dispensed from the brush body in the direction from the center region to the distal region through the third inner hole.

2. The brush of claim 1, wherein the brush body comprises a brush bar.

3. The brush of claim 1, wherein at least one of the first inner hole support or the second inner hole support is closer to a first edge of the two edges than at least one of the third inner hole support or the fourth inner hole support is to the first edge.

4. The brush of claim 1, wherein the second inner hole support and the third inner hole support are a same inner hole support.

5. The brush of claim 1, wherein the fourth inner hole support and the fifth inner hole support are a same inner hole support.

6. The brush of claim 1, wherein:
the first inner hole support is closer to a first edge of the two edges than the second inner hole support is to the first edge,
the second inner hole support is closer to the first edge than the third inner hole support is to the first edge;
the third inner hole support is closer to the first edge than the fourth inner hole support is to the first edge;
the fourth inner hole support is closer to the first edge than the fifth inner hole support is to the first edge; and
the fifth inner hole support is closer to the first edge than the sixth inner hole support is to the first edge.

7. The brush of claim 1, wherein the first size is less than the second size.

8. The brush of claim 1, wherein the first inner hole support and the second inner hole support are disposed between the center region and the distal region.

9. The brush of claim 1, comprising a flow meter configured to control a flow rate of the fluid flowing into the center region.

10. The brush of claim 1, comprising a pressure transducer configured to control a pressure of the fluid flowing into the center region.

11. A brush for cleaning wafers during semiconductor fabrication, comprising:
a brush body, wherein:
the brush body has a center region spaced proximate to an axis of rotation about which the brush body rotates and a distal region spaced away from the axis of rotation,
the brush body has two edges and a mid-point disposed on the axis of rotation,
the mid-point is between the two edges,
the brush body dispenses a fluid flowing into the center region of the brush body, and
the brush body defines:
a first inner hole intersected by a first axis extending parallel to the axis of rotation and having a first size as measured along the first axis,
a second inner hole intersected by the first axis and having a second size as measured along the first axis, and
a third inner hole intersected by the first axis and having a third size as measured along the first axis, wherein:
the third inner hole is nearer to the mid-point of the brush body than the first inner hole and the second inner hole are to the mid-point,
the third size is greater than the first size and the second size such that a flow rate of the fluid near the mid-point is greater than the flow rate near the two edges of the brush body, and
the second size is different than the first third size.

12. The brush of claim 11, wherein the fluid flows from the center region to the distal region through the first inner hole, the second inner hole, and the third inner hole.

13. The brush of claim 11, comprising a flow meter configured to control a flow rate of the fluid flowing into the center region of the brush body.

14. The brush of claim 11, comprising a pressure transducer configured to control a pressure of the fluid flowing into the center region of the brush body.

15. The brush of claim 11, wherein the brush body comprises a brush bar.

16. A brush for cleaning wafers during semiconductor fabrication, comprising:
a brush body configured to rotate about an axis of rotation and comprising:
a center region proximate to the axis of rotation;
a distal region spaced away from the axis of rotation; and
a plurality of inner hole supports lying along a first axis parallel to the axis of rotation and disposed between the center region and the distal region to define openings, intersected by the first axis, through which fluid is dispensed from the brush body in a direction from the center region to the distal region, wherein:
the brush body has a first edge extending perpendicular to the axis of rotation, a second edge extending perpendicular to the axis of rotation, and a mid-point between the first edge and the second edge, and a size of the openings, measured along the first axis, continuously decrease from the mid-point to the first edge.

17. The brush of claim 16, wherein a size of the openings, measured along the first axis, continuously decrease from the mid-point to the second edge.

18. The brush of claim 16, wherein the brush body comprises a brush bar.

19. The brush of claim 11, wherein an opening at the mid-point is larger in size, measured along the first axis, than any other opening intersected by the first axis.

20. The brush of claim 11, comprising a flow meter configured to control a flow rate of the fluid flowing into the center region.

\* \* \* \* \*

UNITED STATES PATENT AND TRADEMARK OFFICE
CERTIFICATE OF CORRECTION

PATENT NO. : 9,781,994 B2
APPLICATION NO. : 13/707947
DATED : October 10, 2017
INVENTOR(S) : Shang-Yuan Yu et al.

Page 1 of 1

It is certified that error appears in the above-identified patent and that said Letters Patent is hereby corrected as shown below:

In the Claims

Column 8, Line 38, Claim 11 please delete the word "third"

Signed and Sealed this
Nineteenth Day of December, 2017

Joseph Matal
*Performing the Functions and Duties of the*
*Under Secretary of Commerce for Intellectual Property and*
*Director of the United States Patent and Trademark Office*